(12) United States Patent
Miyauchi

(10) Patent No.: US 6,408,372 B1
(45) Date of Patent: Jun. 18, 2002

(54) DATA PROCESSING CONTROL DEVICE

(75) Inventor: Shigenori Miyauchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/517,577

(22) Filed: Mar. 2, 2000

(30) Foreign Application Priority Data

Aug. 25, 1999  (JP) ............................................ 11-238119

(51) Int. Cl.[7] .............................................. G06F 12/02
(52) U.S. Cl. ...................... 711/202; 711/167; 711/168; 711/169; 712/209; 712/212; 712/216; 712/218
(58) Field of Search ............................... 711/101, 104, 711/167–169, 202; 712/209, 212, 42, 218, 216; 364/228

(56) References Cited

U.S. PATENT DOCUMENTS

| | | | | |
|---|---|---|---|---|
| 5,297,281 A | * | 3/1994 | Emma et al. | 364/228.1 |
| 5,377,341 A | * | 12/1994 | Kaneko et al. | 711/169 |
| 6,101,596 A | * | 8/2000 | Tanaka et al. | 712/216 |
| 6,161,171 A | * | 12/2000 | Morikawa et al. | 712/42 |
| 6,233,670 B1 | * | 5/2001 | Ikenaga et al. | 712/218 |

FOREIGN PATENT DOCUMENTS

JP          7-036805          2/1995

* cited by examiner

Primary Examiner—Than Nguyen
(74) Attorney, Agent, or Firm—Oblon, Spivak, McClelland, Maier & Neustadt, P.C.

(57) ABSTRACT

A RAM (12) used by the CPU comprises a work buffer (14) and a work register (151) for pipelined processing. The work buffer (14) consists of the first to fourth work buffers (141 to 144) each of which stores information on predetermined data, e.g., a current processing on the data. When the CPU accesses the first to fourth work buffers (141 to 144), an address decoder performs an address conversion on the basis of a value (R151) of the work register (151). For example, when the value (R151) of the work register (151) is "1", addresses (P1, P2, P3 and P4) in an address space are converted (mapped) to addresses (AD141, AD142, AD143 and AD144) of work buffers (141, 142, 143 and 144). With this constitution, in performing a plurality of data processings in parallel, the CPU can improve its operation efficiency while controlling a currently performed processing on each data.

4 Claims, 5 Drawing Sheets

DATA PROCESSING CONTROL DEVICE

BACKGROUND OF THE INVENTION

1. Field of the Invention

The present invention relates to a technique to control a processing of data in a configuration where a plurality of data processings are performed concurrently and in parallel.

2. Description of the Background Art

When a CPU (Central Processing Unit) executes a program, generally, a series of operations combining a plurality of simple operations such as (1) fetch of an instruction, (2) decoding of the instruction and (3) execution of the instruction is repeated. For example, a data transfer processing is performed by repeating such a series of processings.

Now, a discussion will be made on a processing performed by a CPU inside a semiconductor memory device when the memory device receives data in a unit of sector from a host computer (hereinafter referred to as "host"). FIG. 7 is a timing chart showing a case where operations or process steps ST1 to ST4 are executed on data D1 and then the process steps ST1 to ST4 are executed on the next data D2. As shown in FIG. 7, the CPU in the memory device repeats a series of operations, i.e., (A) fetching data and storing it in a sector buffer inside the memory device (step ST1), (B) adding an error correcting code (ECC) to the received data (step ST2), (C) writing the data into a flash memory inside the memory device (step ST3) and (D) checking a write result (step ST4). The priorities of operations which the CPU executes are the steps ST4, ST3, ST2 and ST1 from higher to lower.

One of effective methods of executing a series of operations consisting of the steps ST1 to ST4 at higher speed is pipelining of the data processing. Specifically, respective circuits for the steps ST1 to ST4 are operated independently and in parallel, to improve operation efficiency. Such a pipelined processing is shown in a timing chart of FIG. 8. As shown in FIG. 8, a circuit used for the data fetch operation ST1 consecutively performs the operation ST1 on a plurality of data D1 to D5. As can be seen from comparison between FIGS. 7 and 8, this pipelined processing of FIG. 8 can achieve a throughput twice and half as much as that of the processing of FIG. 7 in the same time period from the time t0 to the time t8.

While the data transfer processing is performed, the CPU always controls the states of the sector buffers used for the data transfer and the states of all the operations during execution. Specifically, the CPU checks whether or not each circuit completes its operation on data and is available for the operation on the next data, and if the circuit is available, the CPU makes the circuit perform the operation on the next data. Further, in the data fetch operation ST1, the CPU performs a control so as to avoid a wrong order of readout of data from the host.

A more specific discussion will be made on the pipelined data transfer processing and the above control of data processing by the CPU. FIG. 9 is a schematic diagram of a conventional address space in a RAM (Random Access Memory) 12P used by the CPU. As shown in FIG. 9, the RAM 12P comprises a firmware processing region 13P for storing instructions or programs (generally termed firmware (F/W)) needed to operate the CPU and an operation region 14P (hereinafter referred to as "work buffer") for controlling a pipelined processing.

The work buffer 14P consists of the first to fourth work buffers 141P to 144P and the four work buffers 141P to 144P each store a current processing of predetermined data under execution. For example, at the time t0 in FIG. 8 (see the state S1), the CPU controls the circuit for the operation ST1 to execute the fetch operation ST1 on the data D1 while writing information indicating that the data D1 is being subjected to the operation ST1 into the first work buffer 141P. After that, at the time t1 (see the state S2), the CPU controls the circuit for the operation ST2 to execute the ECC addition operation ST2 on the data D1 stored in the sector buffer while writing information indicating that the data D1 is being subjected to the operation ST2 into the first work buffer 141P. On the other hand, at the same time t1, the CPU controls the circuit for the operation ST1 to execute the fetch operation ST1 on the data D2 while writing information indicating that the data D2 is being subjected to the operation ST1 into the second work buffer 142P, like the above-discussed state S1. Thus, the operations sequentially proceeds. The first work buffer 141P, for example, is used as a work buffer only for the data D1 until a series of operations ST1 to ST4 on the data D1 are completed.

At this time, as conventional access methods when the CPU uses the work buffers 141P to 144P, (a) a method in which absolute addresses AD141P, AD142P, AD143P and AD144P of the work buffers 141P, 142P, 143P and 144P, respectively, are designated by firmware or in a program, (b) a method in which the address AD141P of the work buffer 141P is used as a base address and the other work buffers 142P, 143P and 144P are designated by offset addresses, and the like are used.

The above addresses AD141P, AD142P, AD143P and AD144P are mapped to addresses P1P, P2P, P3P and P4P, respectively, in the address space of the CPU, and the CPU accesses the addresses P1P, P2P, P3P and P4P to access the above addresses AD141P, AD142P, AD143P and AD144P.

When the CPU performs the above-discussed processing control, generally, the loading of the CPU, in other words, the processing time increases. As a result, the speed of data processing or the performance of data transfer is deteriorated. This tendency becomes more pronounced as the number of data to be pipeline-processed increases. Since the above data processing control is needed when a plurality of data processings are performed in parallel, it is strongly desired that the CPU operates with higher efficiency while performing such a processing control. One of measures to meet such a requirement is to improve an access of the CPU to the work buffers. Specifically, both the conventional access methods (a) and (b) have the following problem.

Discussing in detail, in both the access methods (a) and (b), the CPU has to control the correspondence between the data D1 to D5 and the first to fourth work buffers 141P to 144P. For example, in FIG. 8, the data to be subjected to the operation ST4 to which the highest priority should be assigned by the CPU is changed from the data D1 to the data D2 when the state shifts from the state S4 from the time t3 till the time t4 to the state S5 from the time t4 till the time t5. At that time, with the change of the data to be subjected to the operation ST4, the work buffer to be accessed by the CPU in executing the operation ST4 is changed from the first work buffer 141P to the second work buffer 142P. Therefore, in both the conventional access methods (a) and (b), the CPU itself has to memory and control the addresses AD141P to AD144P of the work buffers to be accessed by the CPU in executing the operations ST1 to ST4.

Further, when the state shifts from the state S4 to the state S5, the first work buffer 141P used only for the data D1 is relieved (in an open state) and available to the next data D5.

Specifically, the CPU always has to memory and control which one of the first to fourth work buffers 141P to 144P is available to the data fetch operation ST1.

Thus, in both the conventional access methods (a) and (b), the CPU has to control not only the data processing control but also the address of the work buffer to be accessed for the processing control and whether the work buffer is available or not.

One of control methods which could lighten the burden for controlling the address of the work buffer and whether available or not is as follows. Specifically, a possible method is to sequentially copy (move) the informations in the second to fourth work buffers 142P to 144P, such as copying the information in the second work buffer 142P to the relieved first work buffer 141P and then copying the information in the third work buffer 143P to the relieved second work buffer 142P and so on. According to this control method, unlike the access methods (a) and (b) in which the first to fourth work buffers 141P to 144P each correspond to the specified data, the work buffers 141P to 144P correspond to the priorities of the operations ST4 to ST1 in this order. Therefore, in executing the operation ST4, for example, the CPU always has only to access the first work buffer 141P. Further, in order to check if the work buffers are available, the CPU has only to access the fourth work buffer 144P. To copy the informations in all the work buffers 141P to 144P as above, however, it takes several tens $\mu$ sec for the CPU. Specifically, it is difficult to achieve the intended object of improving the operation efficiency of the CPU, in other words, to perform the data processing at higher speed.

SUMMARY OF THE INVENTION

The present invention is directed to a data processing control device. According to a first aspect of the present invention, the data processing control device comprises: a CPU for performing a control of a processing performed on each of a plurality of data which is sequentially processed through a plurality of process steps which can be concurrently performed, the control being made by using a plurality of first addresses which are different from one another and in correspondence with the plurality of process steps; a plurality of control memory units having a plurality of second addresses which are different from one another, for storing information on the plurality of data on a data-by-data basis; and an address conversion unit for associating the plurality of first addresses and the plurality of second addresses in an address correspondence which varies as the processing is shifted.

According to a second aspect of the present invention, in the data processing control device of the first aspect, the plurality of data are subjected to the same processing, and the plurality of first addresses circularly changes with respect to each of the second addresses as the processing is shifted.

According to third and fourth aspects of the present invention, in the data processing control device of the first and second aspects, the plurality of data include first data and second data, and as the processing is shifted from a state where the second data is processed in the process step whose priority is lower than the process step for processing the first data to a state where the second data is processed in the process step whose priority is higher than the process step for processing the first data, in the address correspondence, one of the first addresses associated with one of the second addresses with respect to the first data is interchanged with another one of the first addresses associated with another one of the second addresses with respect to the second data.

In the data processing control device of the first aspect, the first addresses correspond to the process steps of the data and are associated with the second addresses in the address correspondence which varies as the processing is shifted. Therefore, it is not necessary to move the contents stored in the control memory units as the processing is shifted. Moreover, the CPU can grasp the currently-performed processing in a desired process step by selecting one of the first addresses without controlling which data is processed in each of the process steps. Therefore, it is possible to reduce the loading and processing time needed to control the currently-performed processing as compared with the background-art device. At this time, a program which the CPU executes to control the processing become simpler and smaller than a background-art program. As a result, the operation efficiency of the CPU can be improved.

In the data processing control device of the second aspect, when a plurality of data are subjected to the same processing, if the processing order of the data does not change or differ by process steps, the correlation between the order of the first addresses and the order of the second addresses is not broken even if the first addresses are circularly changed. Therefore, the CPU can use an offset address with respect to one of the first addresses to access a desired control memory unit. At this time, since it is not necessary to write all the first addresses in a program executed by the CPU, the program can be easily made simpler and smaller.

In the data processing control device of the third and fourth aspects, even when it is changed in accordance with the currently-performed processing whether the process step for processing the first data is performed before or after the process step for processing the second data, by using the first addresses, it is possible to reliably control the currently-performed processing, in accordance with the process step.

An object of the present invention is to provide a data processing control device which allows an improvement in operation efficiency.

These and other objects, features, aspects and advantages of the present invention will become more apparent from the following detailed description of the present invention when taken in conjunction with the accompanying drawings.

DESCRIPTION OF THE PREFERRED EMBODIMENTS

<The First Preferred Embodiment>

Figure 1:
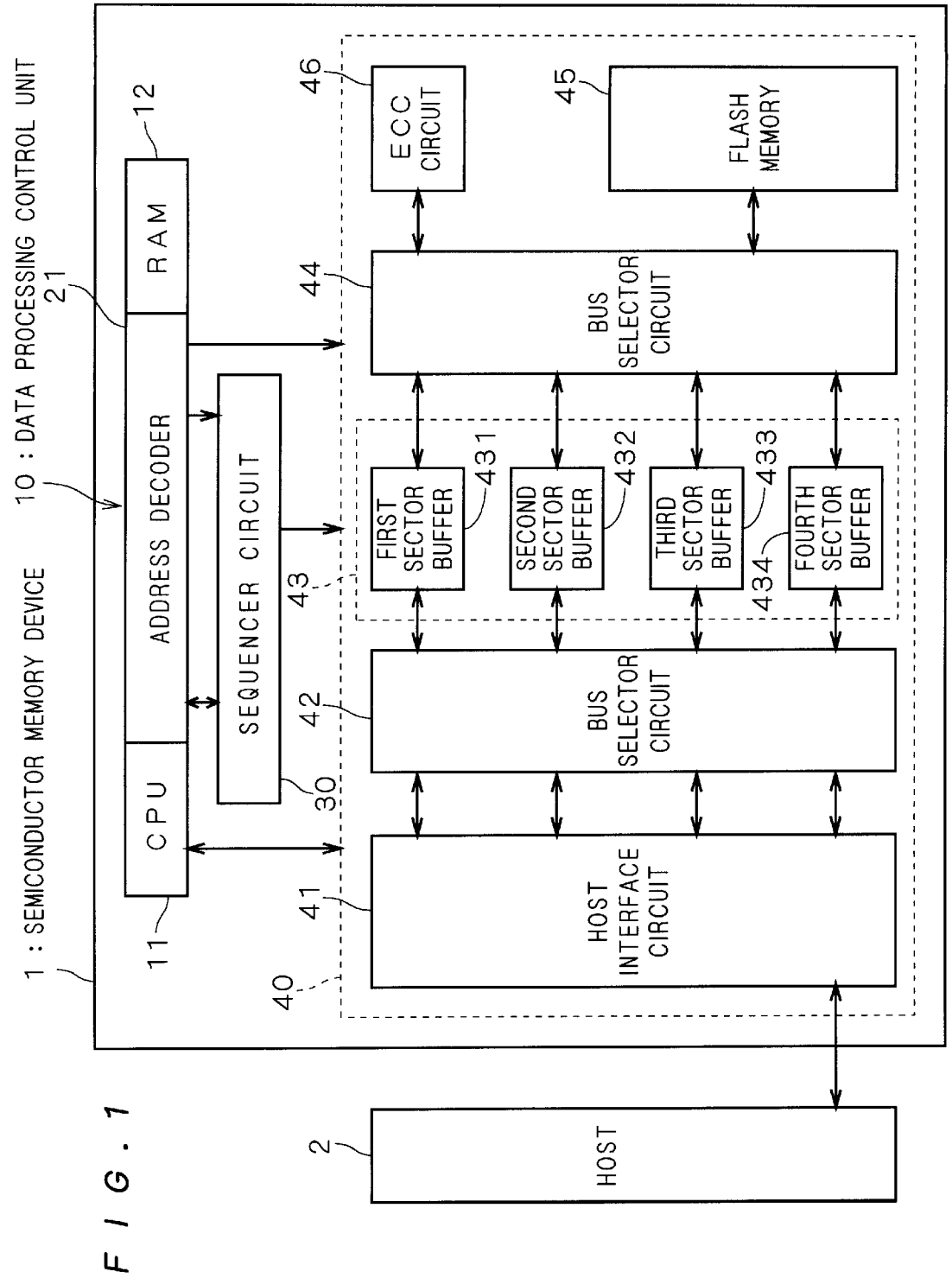
FIG. 1 is a schematic block diagram showing a configuration of a semiconductor memory device in accordance with a first preferred embodiment.

FIG. 1 is a schematic block diagram showing a configuration of a semiconductor memory device 1 in accordance with the first preferred embodiment. As shown in FIG. 1, the semiconductor memory device 1 is connected to a host 2. The semiconductor memory device 1 comprises a host interface circuit 41 for transmitting data with the host 2, a flash memory 45 for storing the data and a sector buffer 43 interposed between the circuit 41 and the memory 45. The sector buffer 43 temporally stores the data to be transferred from the host 2 to the flash memory 45 or from the flash memory 45 to the host 2. Further, as shown in FIG. 1, the sector buffer 43 consists of the first to fourth sector buffers 431 to 434. The flash memory 45 may consist of a plurality of flash memories.

Each of the first to fourth sector buffers 431 to 434 is connected to the host interface circuit 41 through a bus selector circuit 42 and connected to the flash memory 45 through the bus selector circuit 44. The bus selector circuit 42 selects one of data buses, and the connection between the host interface circuit 41 and the first to fourth sector buffers 431 to 434 is thereby controlled. Similarly, a bus selector circuit 44 selects one of data buses, and the connection between the flash memory 45 and the first to fourth sector buffers 431 to 434 is thereby controlled.

The semiconductor memory device 1 further comprises an ECC circuit 46 connected to the bus selector circuit 44. The ECC circuit 46 generates a code (ECC) for correcting an error of the data received from the host 2, and detects if there is an error of the data fetched from the flash memory 45 and corrects the error if there is.

In the following discussion, an element constituted of the circuits 41 to 46 is also referred to as "a transfer unit 40".

The semiconductor memory device 1 further comprises a CPU 11 and a sequencer circuit 30. The CPU 11 controls the circuits 41 to 46 and transmits data and signals with the circuits 41 to 46 directly or through the sequencer circuit 30. A data transfer processing based on the above-discussed operations or process steps ST1 to ST4 are thereby performed between the host 2 and the flash memory 45. The sequencer 30 generates a predetermined control signal or a control signal waveform and output it on the basis of instructions from the CPU 11, to control the circuits 41 to 46.

For example, the data fetch operation ST1 is executed as follows. First, the sequencer circuit 30 generates a control signal for data fetch operation ST1 on the basis of an instruction from the CPU 11 and controls the host interface circuit 41, the bus selector circuit 42 and the sector buffer 43 with this control signal. Through this control, the operation ST1, i.e., the transfer operation between the host and the sector buffer is executed. At this time, the host interface circuit 41, the bus selector 42 and the sector buffer 43 serve as circuits for the operation ST1.

Similarly, the sequencer circuit 30 controls the sector buffer 43, the bus selector circuit 44 and the ECC circuit 46 with a control signal for the operation ST2, to execute the ECC addition operation ST2. At this time, the sector buffer 43, the bus selector circuit 44 and the ECC circuit 46 serve as circuits for the operation ST2. The operation in the ECC circuit 46 will be discussed later in detail. The write operation ST3 is executed by controlling the sector buffer 43, the bus selector circuit 44 and the flash memory 45 which serve as circuits for the operation ST3 with a control signal for the operation ST3. In contrast to these operations, the CPU 11 directly checks a status of the flash memory 45, to execute the write check operation ST4.

At this time, the sequencer circuit 30 independently generates the control signals for the operations ST1 to ST3, to achieve pipelining of the operations ST1 to ST4.

Now, more discussion will be made on the operation of the ECC circuit 46 in the ECC addition operation ST2.

First, a discussion will be made on a case where the data is transferred from the host 2 to the flash memory 45, in other words, where the data is coded. In the data fetch operation ST1, the data transferred to one of the sector buffers 43, e.g., the first sector buffer 431 is copied to the ECC circuit 46 through the bus selector circuit 44. The ECC circuit 46 generates an ECC on the basis of the copied data and stores the ECC in a register inside the circuit 46. Next, the CPU 11 adds the stored ECC to the data in the first sector buffer 431. After that, in the write operation ST3, the data with the ECC is transferred to the flash memory 45 through the bus selector circuit 44.

When the data is transferred from the flash memory 45 to the host 2, in other words, when the data is decoded, the ECC circuit 46 performs the following operation. First, the sequencer circuit 30 transfers the data with the ECC in the flash memory 45 to both the ECC circuit 46 and e.g., the first sector buffer 431 through the bus selector circuit 44. The ECC circuit 46 decodes the transferred data and stores the decoded result therein. At this time, when there is an error and the error can be corrected, the ECC circuit 46 generates correcting data and stores it in the register inside the ECC circuit 46. Then, the CPU 11 checks the decoded result and when there is an error, the CPU 11 corrects the data in the first sector buffer 431 with the correcting data. After that, the sequencer circuit 30 transfers the data in the first selector buffer 431 to the host 2 through the bus selector circuit 42 and the host interface circuit 41.

Figure 2:
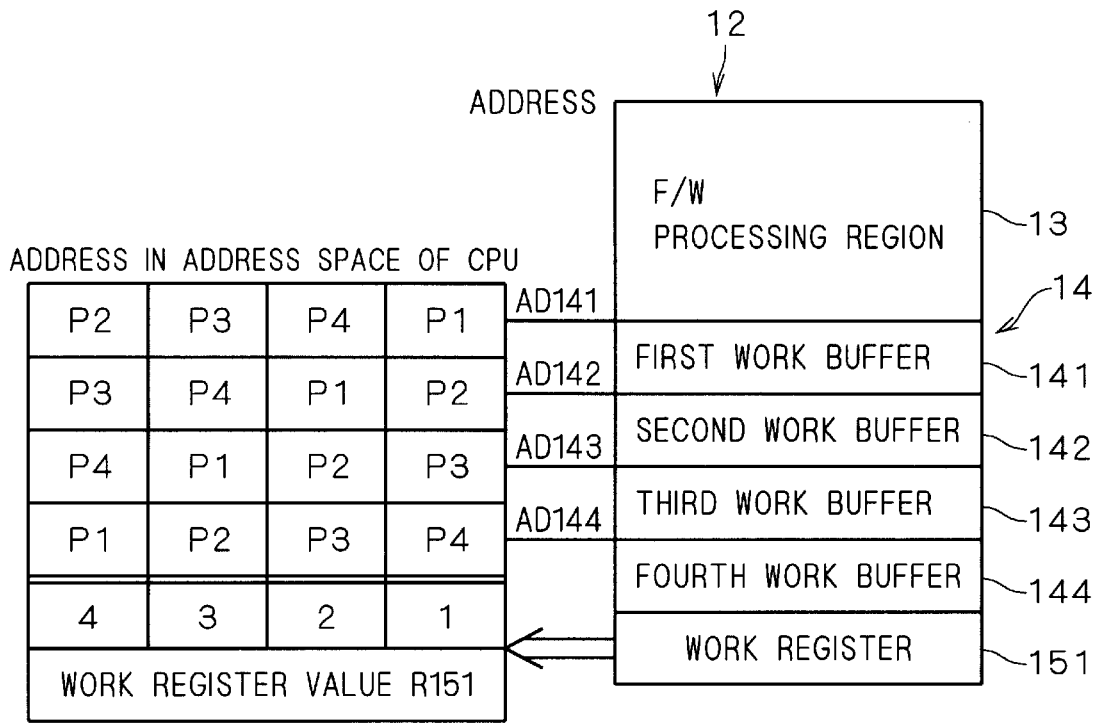
FIG. 2 is a schematic diagram showing an address conversion in accordance with the first preferred embodiment.
Figure 3:
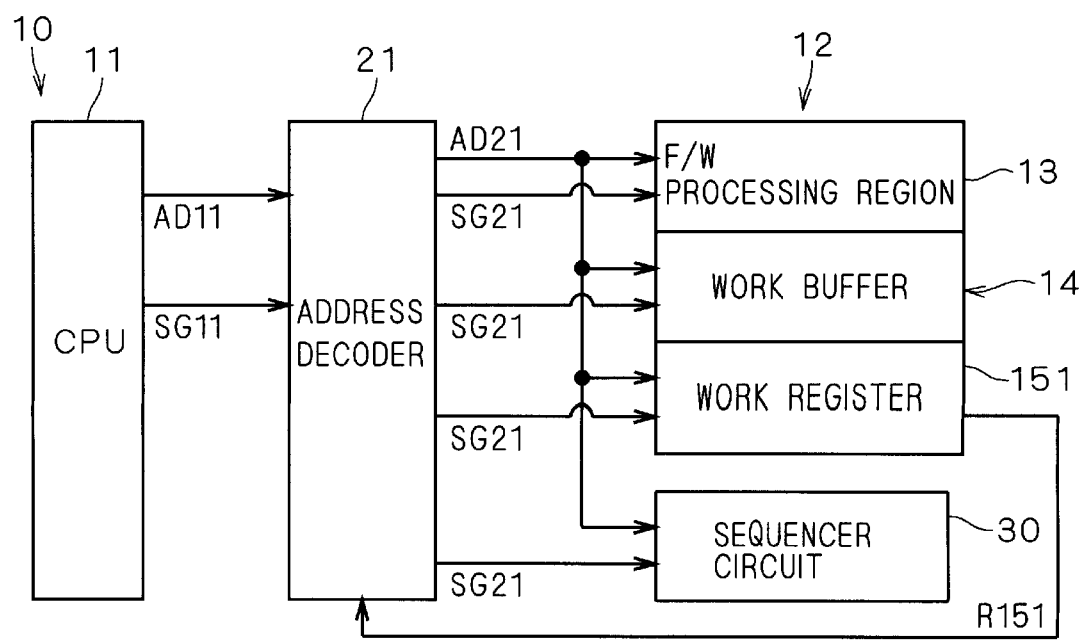
FIG. 3 is a schematic block diagram showing a configuration of a data processing control unit in accordance with the first preferred embodiment.

The semiconductor memory device 1 further comprises an address decoder (an address conversion unit) 21 for converting an address (the first address) inside an address space (not shown) of the CPU 11 into a predetermined address and a RAM 12 used by the CPU 11. The above data processing operations ST1 to ST4 are controlled by a data processing control unit (data processing control device) 10 consisting of the CPU 11, the address decoder 21 and the RAM 12 (especially, a work buffer 14 and a work register 151 inside the RAM 12). Referring to FIGS. 2 and 3 as well as FIG. 1, a discussion will be made on the data processing control unit 10. FIG. 2 is a schematic diagram showing an address space in the RAM 12 and FIG. 3 is a block diagram for explanation of an operation in the data processing control unit 10, particularly in the address decoder 21.

As shown in FIG. 2, the RAM 12 comprises a firmware processing region 13 for storing firmware (F/W) needed to operate the CPU 11, the work buffer (control memory unit) 14 for controlling the pipelined processing and the work register 151. The work buffer 14 consists of the first to fourth work buffers 141 to 144 and the work buffers 141 to 144 are used only for different predetermined data, respectively, until a series of operations ST1 to ST4 are completed. Each of the work buffers 141 to 144 stores information of predetermined data, such as data name and currently-performed processing, for each data. The work register 151 is accessible by the CPU 11 and stores a predetermined value (discussed later in detail) set by the CPU.

In the address space of the CPU 11, registers of the peripheral circuits such as the RAM 12 and the sequencer circuit 30 are mapped. The mapping method, in other words, the address conversion operation in the address decoder 21 will be discussed referring to 10 FIG. 3. When the CPU 11 accesses a predetermined address AD11 in the address space, the CPU 11 outputs the address AD11 and a selection signal SG11 indicating what is designated by the address AD11, in other words, which one of the F/W processing region 13, the work buffer 14, the work register 15 and the sequencer circuit 30 is designated by the address AD11 to the address decoder 21. The address decoder 21 converts the address AD11 into an address AD21 designating a predetermined circuit to be accessed on the basis of the selection signal SG11. By transferring a selection signal SG21 only to a circuit to be accessed, which is specified by the selection signal SG11, the CPU 11 can access the desired address AD21 of the desired circuit to be accessed, i.e., one of the F/W processing region 13, the work buffer 14, the work register 151 and the sequencer circuit 30.

Particularly, when the CPU 11 accesses the first to fourth work buffers 141 to 144, the address decoder 21 of the first preferred embodiment performs an address conversion on the basis of a value R151 of the work register 151. As shown in FIG. 2, when the value R151 of the work register 151 is "1", addresses (the first addresses) P1, P2, P3 and P4 in the address space of the CPU 11 are converted (mapped) to the addresses the second addresses) AD141, AD142, AD143 and AD141 (the leading address) of the work buffers 141, 142, 143 and 144, respectively. When the value R151 of the work register 151 is "2", the addresses P1, P2, P3 and P4 are converted into the addresses AD142, AD143, AD144 and AD141, respectively. As shown in FIG. 2, the addresses P1, P2, P3 and P4 are circularly changed (rotated) with respect to the first to fourth work buffers 141 to 144 on the basis of the value R151 of the work register 151.

Figure 4:
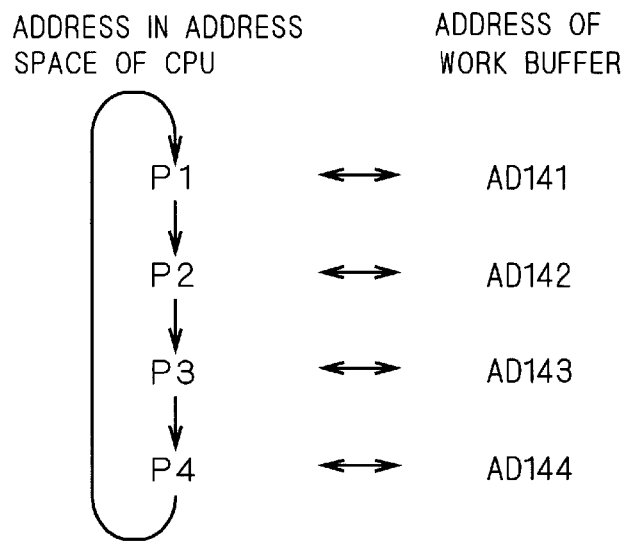
FIG. 4 is a schematic diagram showing an address circulation.

The above term "circularly changing (rotating)" will be discussed herein. As shown in FIG. 4, the addresses P1 to P4 are circularly associated, as the address P1→the address P2→the address P3→the address P4→the address P1. Further, by a basic function of the address decoder 21, the addresses P1, P2, P3 and P4 are associated (converted) to any of the addresses AD141 to AD144. The correspondence of the addresses shown in FIG. 4 is used when the value R151 of the work register 151 is "1" as shown in FIG. 2. Thus, it is expressed as "circular change (of the addresses P1, P2, P3 and P4)" that the addresses P1, P2, P3 and P4 sequentially shift with respect to the addresses AD141 to AD144 while keeping the above circular association. Herein, the addresses P1 to P4 are circularly changed in such a direction as to associate the address P1 to the address AD141→the address AD142→. . . , sequentially.

Each correspondence obtained through the circulation is further associated to the value R151 (="1" to "4") of the work register 151, as shown in FIG. 2. The addresses P1 to P4 in the address space of the CPU 11 are thereby changed into the addresses AD141 to AD144 of the first to the fourth work buffers 141 to 144 on the basis of the value R151 (="1" to "4") of the work register 151.

The address decoder 21 performs an address conversion, for example, as follows.

The correspondence between the addresses P1 to P4 and the addresses AD141 to AD144 in a case, for example, where the value R151 of the work register 151 is "1" is applied to the address decoder 21 in advance. Then, as shown in FIG. 3, when the address decoder 21 receives the signal SG11 for selecting the work buffer 14, the address decoder 21 refers to the value R151 of the work register 15, not based on the selection signal SG21. For example, when the reference value R151 is "3", it is possible to obtain a predetermined correspondence by shifting (circulating) the correspondence which is applied in advance twice in the above direction. The address decoder 21 performs an address conversion on the basis of the obtained predetermined correspondence.

The data processing control unit 10 controls information on the data D1 to D5 (see FIG. 8) which are pipeline-processed as follows. The data processing control unit 10 has a characteristic feature in a method by which the CPU 11 accesses the first to fourth work buffers 141 to 144, so the following discussion will be centered on this point.

Figure 8:
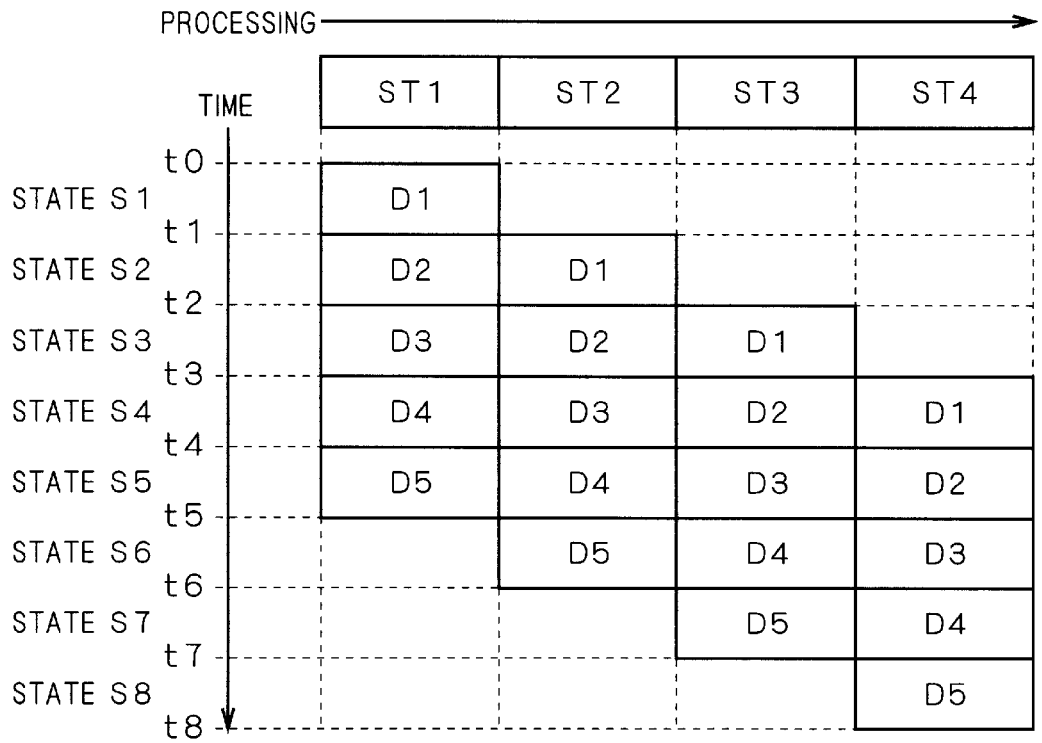
FIG. 8 is a timing chart in a case where the CPU performs a series of operations being pipelined.
Figure 9:
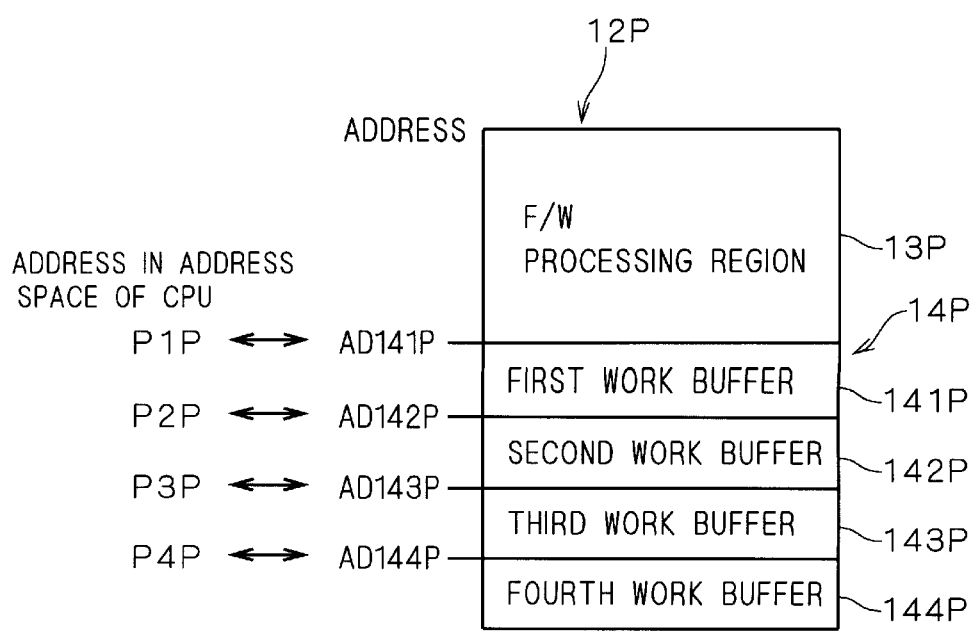
FIG. 9 is a schematic diagram showing an address space of a RAM used by the CPU in the background art.

First, like in the conventional semiconductor memory device, the first to fourth work buffers 141, 142, 143 and 144 are assigned to the data D1, D2, D3 and D4, respectively, during the states S1 to S4 of FIG. 8. At this time, the CPU 11 sets the value R151 of the work register 151 at "1". The CPU 11 can thereby access the first to fourth work buffers 141, 142, 143 and 144 by accessing the addresses P1, P2, P3 and P4.

Next, when the state shifts from the state S4 to the state S5, the first work buffer 141 which has been used only for the data D1 until the state S4 is relieved and used for the data D5 to be fetched next. With this shift, the CPU 11 writes "2" into the work register 151. The CPU 11 can thereby access the work buffers 142, 143, 144 and 141 by accessing the addresses P1, P2, P3 and P4 (see FIG. 2). At this time, the CPU 11 continues to use the addresses in the address space of the CPU 11 with respect to the data D2 to D4, to proceed the operations.

Similarly, the CPU 11 changes the value R151 of the work register 151 to "3" as the state shifts from the state S5 to S6, and the CPU 11 changes the value R151 of the work register 151 to "4" as the state shifts from the state S6 to S7. Thus, the CPU 11 changes the value R151 of the work register 151 as the data processing is shifted, the address decoder 21 thereby circularly changes the addresses P1 to P4 with respect to the addresses AD141 to AD144. Thus, the address decoder 21 associates the addresses P1 to P4 with the addresses AD141 to AD144 in a correspondence which varies as the processing is shifted.

Particularly, as can be seen from FIGS. 2 and 8, according to the above correspondence of the addresses P1 to P4 and the addresses AD141 to AD144 (see FIG. 2), the following correspondence is always held. Setting priorities to a plurality of data which are subjected to the pipelined processing in descending order from one closest to the operation ST4 to respond to the order of priorities of the operations ST1 to ST4, the work buffer storing the information on the data of highest priority is referred to as "work buffer of highest priority". For example, the work buffer of highest priority before the state S4 is the first work buffer 141 and the work buffer of highest priority in the state S5 is the second work buffer 142. At this time, the address AD141, AD142, AD143 or AD144 of the work buffer of highest priority is always associated with the address P1. In other words, the CPU 11 can always accesses the work buffer of highest priority by accessing the address P1. Similarly, the addresses P2, P3 and P4 are associated with the work buffer of second highest priority, that of third highest priority and that of lowest priority, respectively. In other words, the order of the addresses P1, P2, P3 and P4 always corresponds to the descending order of priorities of the work buffers, i.e., the descending order of priorities of the process steps ST1 to ST4.

Thus, the addresses P1 to P4 in the address space of the CPU 11 correspond to the process steps ST1 to ST4 and are associated with the addresses AD141 to AD144 by the address decoder 21 in a correspondence which varies as the data processing is shifted. Therefore, it is not necessary to transfer the contents or information stored in the work buffers 141 to 144 as the processing is shifted. Moreover, the CPU 11 can grasp the currently-performed processing in a desired steps among the process steps ST1 to ST4 by selecting one of the addresses P1 to P4 without controlling which data among the data D1 to D5 is processed in each of the process steps ST1 to ST4. Therefore, it is possible to reduce the loading and processing time needed for the CPU 11 to control the processing as compared with the background art. That improves operation efficiency of the CPU 11. At this time, since there is no need of describing the above move operation and the correspondence between the data D1 to D5 and the process steps ST1 to ST4 in the firmware, it is possible to simplify and down-size the firmware. In short, a firmware of excellent efficiency can be constructed.

If the processing order of a plurality of data D1 to D5 in the process steps ST1, ST2, ST3 and ST4 does not change on a step-by-step basis when the data D1 to D5 are sequentially subjected to the same processing such as the pipelined processing shown in FIG. 8, the correlation between the order of the addresses P1 to P4 and that of the addresses AD141 to AD144 is not broken even when the addresses P1 to P4 are circularly changed as shown in FIG. 2. For this reason, for example, with the address P1 as a base address, an offset address can be used as each of the addresses P1 to P4. At this time, since there is no need for describing all the addresses P1 to P4 in the firmware, it is possible to easily simplify and down-size the firmware. Also from this point, the operation efficiency of the CPU 11 can be improved.

As a result, the semiconductor memory device 1 can perform data transfer with higher efficiency at higher speed as compared with the conventional semiconductor memory device.

Further, for example, when values "0" to "3" are used as the value R151 of the work register 151 instead of "1" to "4", there may be a case where a counter (not shown) which is incremented by +1 by the CPU 11 as the operations ST4 is ended is prepared and the remainder when the counter value is divided by 4 is written into the work register 151.

<The Second Preferred Embodiment>

Figure 5:
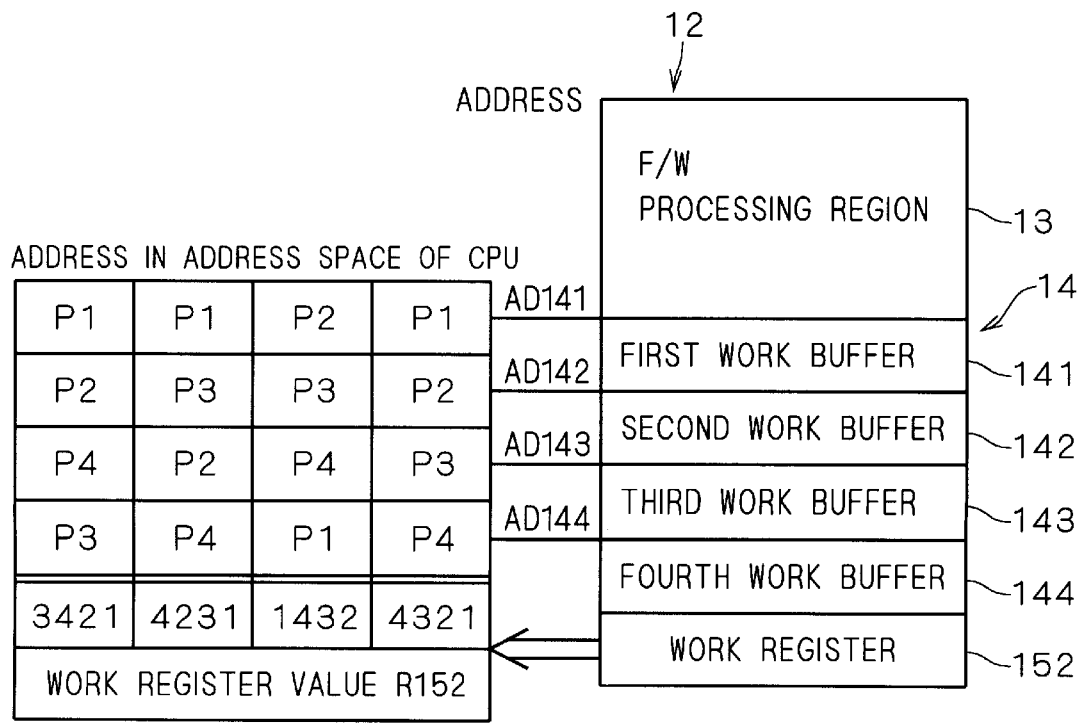
FIG. 5 is a schematic diagram showing an address conversion in accordance with a second preferred embodiment.

Next, a semiconductor memory device in accordance with the second preferred embodiment will be discussed. This device has the same configuration as the above discussed semiconductor memory device 1 (see FIGS. 1 and 3) and has a characteristic feature in address conversion of the address decoder 21. Therefore, the following discussion will be centered on this point and elements identical to those discussed earlier are given the same reference signs to help a detailed discussion. FIG. 5 is a schematic diagram showing an address conversion of the second preferred embodiment in the address decoder 21. A work register 152 in FIG. 5 corresponds to the above-discussed work register 151 (see FIG. 2).

Particularly, in the data processing control unit 10 of the second preferred embodiment, the CPU 11 directly specifies the priorities of the work buffers 141 to 144 and describes the priorities into the work register 152. As shown in FIG. 5, for example, when the work buffers 141, 142, 143 and 144 are prioritized in this order, the CPU 11 writes "4321" into the work register 152. The address decoder 21 thereby refers to a value R152 (="4321") of the work register 152 and assigns descending priorities to the work buffers 141, 142, 143 and 144 in this order, to associate the descending priorities with the order of the addresses P1→P2→P3→P4 (corresponding to the descending priorities of the process steps ST1 to ST4). This order of priorities corresponds to that in a case where "1" is set to the work register 151 (see FIG. 2). Herein, the rightmost number or the lowest number in the numeric row constituting "4321" has the highest priority. At this time, to represent a value of four digits consisting of four kinds of numbers (characters) of "1" to "4", the work register 152 is a 16-digit register.

Similarly, by writing "1432" into the work register 152, prioritization and association corresponding to those in the case where "4" is set to the work register 151 (see FIG. 2) can be achieved. Further, as another example, when the value R152 of the work register 152 is "3421", the addresses P1, P2, P3 and P4 are associated with the addresses AD141, AD142, AD144 and AD143 in this order. At this time, like in the first preferred embodiment, it is not necessary to sequentially move the contents or information stored in the work buffers 141 to 144.

According to the data processing control unit 10 of the second preferred embodiment, the order of priorities of the work buffers 141 to 144 can be arbitrarily designated by the value R152 written into the work register 152. For this reason, the control unit 10 can be also applied to a case where the order of a series of operations ST1 to ST4 is changed in pipelining in accordance with how each data is processed. The data processing control unit 10 of the second preferred embodiment will be discussed in detail, taking such a case where the processing order is changed, as an example. In this preferred embodiment, the flash memory 45 consists of two flash memories.

Figure 6:
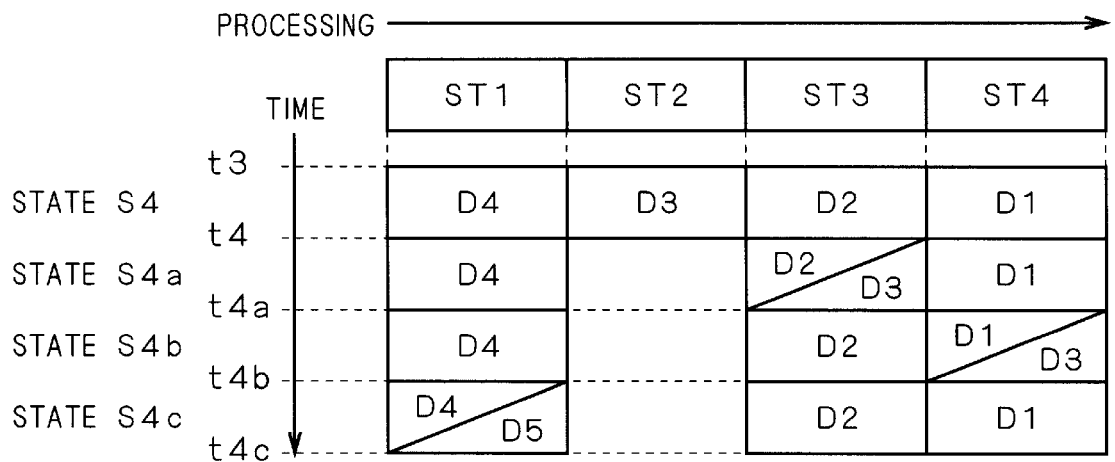
FIG. 6 is a schematic block diagram showing a configuration of a semiconductor memory device in accordance with the second preferred embodiment.
Figure 7:
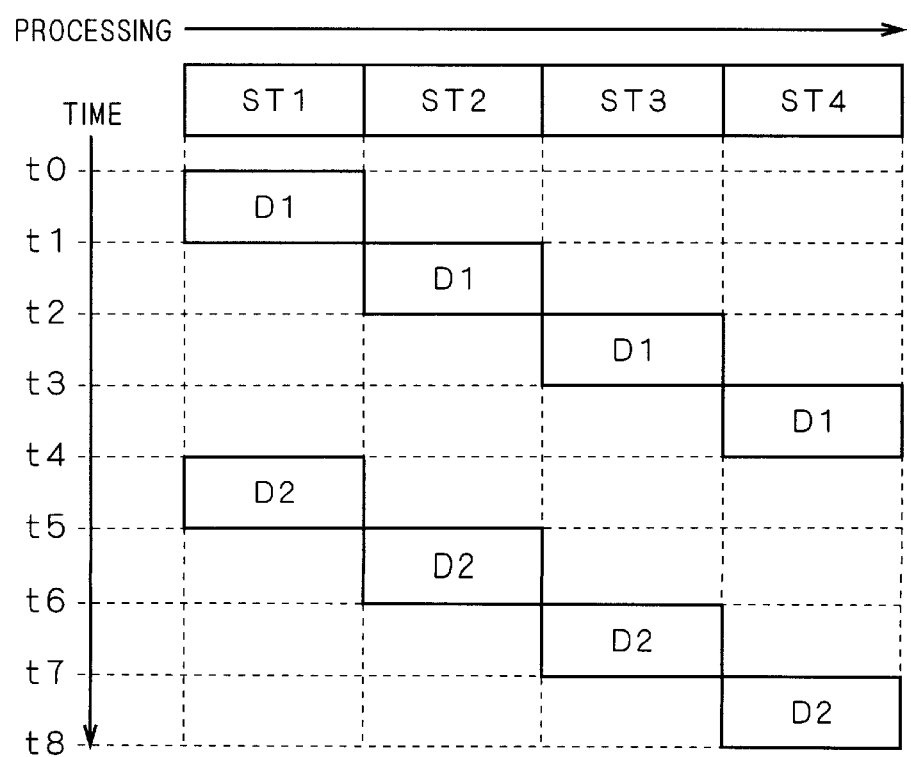
FIG. 7 is a timing chart in a case where a CPU performs a series of operations not being pipelined.

For example, when the ECC addition operation on the data D3 is ended while the data D2 is written into one of the flash memories in the state S4 (time t3 to time t4) of FIG. 8, the data D3 can be written into the other flash memory in a standby mode as shown in the state S4a of FIG. 6 corresponding to FIG. 8. For easy understanding of this discussion, the data D1 and D4 are not shifted to the respective next operations.

The flash memory can delete and write data in a unit of block of, e.g., about 512 Byte to several KByte. Though it takes several $\mu$ sec to several msec to write an above-sized block of data, this write time varies according to the write blocks. A case where write of the data D3 is ended before that of the data D2 is ended may be caused by this variation in write time. At this time, as shown in the state S4b of FIG. 6, the CPU 11 executes the write check operation ST4 on the data D3 without waiting the end of the write operation ST3 and write check operation ST4 on the data D2. This relieves the third work buffer 143 which is used only for the processing of the data D3. After relieving the buffer 143, the fetch operation ST1 on the next data D5 is executed as shown in the state 4c of FIG. 6.

At this time, as the state shifts from the state S4 where the data D3 is processed in the process step ST2 whose priority is lower than the process step ST3 on the data D2 to the state S4b where the data D3 is processed in the process step ST4 whose priority is higher than the process step ST3 on the data D2, the CPU 11 changes the value R152 of the work register 152 from "4321" (see FIG. 5) to "4231" (see FIG. 5). Specifically, in the correspondence of FIG. 5, the address P3 associated with the address AD143 of the third work buffer 143 storing the information on the data D3 and the address P2 associated with the address AD142 of the second work buffer 142 storing the information on the data D2 are interchanged with each other. With this interchange, correspondence of the descending priority order of the work buffers 141 to 144 and the order of the addresses P1→P2→P3→P4 (in other words, the descending priority order of the process steps ST1 to ST4) can be changed. Therefore, by using the addresses P1 to P4, the processing control can be reliably achieved according to the process steps ST1 to ST4.

Actually, since the write check operation ST4 on the data D1 can be ended at the state S4a, the first work buffer 141 is also relieved to lower its priority. Further, at the point of time the data D2 is shifted to the write operation ST3, the ECC addition operation ST2 on the data D4 is executable.

Transfer of the data D2 and D3 to the flash memory 45 can be performed as follows. Specifically, the write operation ST3 mainly includes (i) an operation of transferring data from the sector buffer 43 to the flash memory 45 and (ii) an operation of writing data into the memory cell performed in the flash memory 45. Therefore, even if the bus selector circuit 44 is switched after the data transfer operation (i) is ended, the write operation (ii) can be performed. It takes time on the order of $\mu$ sec to perform the operation (i) while it takes time on the order of msec to perform the operation (ii). Therefore, after the operation (i) of transferring one of the data D2 and D3 to the above memory cell, the bus selector circuit 44 is switched, to perform the operation (i) of transferring the other one of the data D2 and D3 to a predetermined flash memory. It is natural that the bus selector circuit 44 may have a constitution which can form a bus for each of the two data.

Thus, when the order of data processings is changed in accordance with the currently-performed processing on respective data, by appropriately changing the value R152 of the work register 152, the data processing control unit 10 of the second preferred embodiment can be flexibly adapted. As a result, since a higher-efficiency pipelining is achieved by appropriately changing the processing order, a data transfer can be performed with higher efficiency at higher speed as compared with the semiconductor memory device 1 of the first preferred embodiment.

<The Third Preferred Embodiment>

In the data processing control unit 10, the address decoder 21 may have a constitution which allows both the address conversions of the first and second preferred embodiments. At this time, for example, the address decoder 21 or the CPU 11 performs a control such that the values R151 and R152 of the work registers 151 and 152 may be reflected on each other. For example, when the address conversion of the first preferred embodiment is performed after that of the second preferred embodiment, with the value R152 written in the work register 152 as a base, the addresses P1 to P4 are circularly changed on the basis of the value R151 of the work register 151.

With this constitution, according to the processing performed on the data, correspondence between the addresses P1 to P4 and the addresses AD141 to AD144 is changed by either method, to adequately achieve an effect which both the address conversion methods produce. Therefore, a data transfer can be performed with still higher efficiency as compared with a case where either of the address conversion methods is used.

Though the above discussion has been made on the case of transferring data from the host 2 to the flash memory 45, the above-discussed data processing control unit 10 can be applied to a case of transferring data from the flash memory 45 to the host 2. Further, it is obvious that the data processing control unit 10 can be applied to a case where a memory unit which corresponds to the flash memory 45 and a memory unit which corresponds to the host 2 are provided in the same device. Furthermore, the above representation of the values R151 and R152 written into the work registers 151 and 152 is an exemplary one and it goes without saying that a various forms of representation can be used.

The operation to associate the addresses P1 to P4 with the addresses AD141 to AD144 in a correspondence which varies as the processing is shifted can be applied to a pipelined processing. Specifically, even when data processings are not in series, in other words, when all of a plurality of data are not be subjected to the same processing, only if a plurality of data are sequentially processed in a plurality of process steps which can be concurrently executed, the above address association can be made and the processing on each data can be thereby controlled.

While the invention has been shown and described in detail, the foregoing description is in all aspects illustrative and not restrictive. It is therefore understood that numerous modifications and variations can be devised without departing from the scope of the invention.

What is claimed is:

1. A data processing control device, comprising:

a CPU for performing a control of a processing performed on each of a plurality of data which is sequentially processed through a plurality of process steps which can be concurrently performed, said control being made by using a plurality of first addresses which are different from one another and in correspondence with said plurality of process steps;

a plurality of control memory units having a plurality of second addresses which are different from one another, for storing information on said plurality of data on a data-by-data basis; and an address conversion unit for associating said plurality of first addresses and said plurality of second addresses in an address correspondence which varies as said processing is shifted.

2. The data processing control device according to claim 1, wherein said plurality of data are subjected to the same processing, and said plurality of first addresses circularly changes with respect to each of said second addresses as said processing is shifted.

3. The data processing control device according to claim 1, wherein said plurality of data include first data and second data, and as said processing is shifted from a state where said second data is processed in said process step whose priority is lower than said process step for processing said first data to a state where said second data is processed in said process step whose priority is higher than said process step for processing said first data, in said address correspondence, one of said first addresses associated with one of said second addresses with respect to said first data is interchanged with another one of said first addresses associated with another one of said second addresses with respect to said second data.

4. The data processing control device according to claim 2, wherein said plurality of data include first data and second data, and as said processing is shifted from a state where said second data is processed in said process step whose priority is lower than said process step for processing said first data to a state where said second data is processed in said process step whose priority is higher than said process step for processing said first data, in said address correspondence, one of said first addresses associated with one of said second addresses with respect to said first data is interchanged with another one of said first addresses associated with another one of said second addresses with respect to said second data.

* * * * *

UNITED STATES PATENT AND TRADEMARK OFFICE
CERTIFICATE OF CORRECTION

PATENT NO.     : 6,408,372 B1
DATED          : June 18, 2002
INVENTOR(S)    : Miyauchi It is certified that error appears in the above-identified patent and that said Letters Patent is hereby corrected as shown below:

<u>Title page, Item [54] and Column 1, lines 1-2,</u>
Title should read: -- [54] DEVICE FOR CONCURRENTLY PROCESSING DATA USING PIPELINE PROCESSING --

Signed and Sealed this

Fifteenth Day of October, 2002

*Attest:*

JAMES E. ROGAN
*Attesting Officer*    *Director of the United States Patent and Trademark Office*